United States Patent [19]
Rahman et al.

[11] Patent Number: 5,976,761
[45] Date of Patent: Nov. 2, 1999

[54] FRACTIONATION OF PHENOL FORMALDEHYDE CONDENSATE AND PHOTORESIST COMPOSITIONS PRODUCED THEREFROM

[75] Inventors: M. Dalil Rahman, Flemington; Daniel P. Aubin, Oxford; Dinesh N. Khanna; Sunit S. Dixit, both of Flemington, all of N.J.

[73] Assignee: Clariant Finance (BVI) Limited, Virgin Islands (Br.)

[21] Appl. No.: 09/047,571

[22] Filed: Mar. 25, 1998

Related U.S. Application Data

[62] Division of application No. 08/530,847, Sep. 20, 1995, Pat. No. 5,739,265.

[51] Int. Cl.[6] .............................. G03F 7/004; C08J 3/00
[52] U.S. Cl. .................. 430/270.1; 210/661; 210/681; 210/683; 210/685; 210/686; 210/688; 528/129; 528/139; 528/144; 528/155; 528/165; 430/326
[58] Field of Search .............................. 430/270.1, 192, 430/326; 210/661, 681, 683, 685, 686, 688; 528/129, 139, 144, 155, 165

[56] References Cited

U.S. PATENT DOCUMENTS

| | | | |
|---|---|---|---|
| 3,106,465 | 10/1963 | Neugebauer et al. | 96/33 |
| 4,033,909 | 7/1977 | Papa | 260/2.5 F |
| 4,719,167 | 1/1988 | Miura et al. | 430/192 |
| 5,378,802 | 1/1995 | Honda | 528/480 |
| 5,521,052 | 5/1996 | Rahman et al. | 430/270.1 |
| 5,693,749 | 12/1997 | Rahman et al. | 430/270.1 |

FOREIGN PATENT DOCUMENTS

| | | |
|---|---|---|
| WO 93/12152 | 6/1993 | WIPO. |
| WO 93/18437 | 9/1993 | WIPO. |

OTHER PUBLICATIONS

Chemistry & Application of Phenolic Resins, A. Knap & W. Scheib, Springer Verlag, New York 1979, Chapter 4.

Light Sensitive Systems, J. Kosar, John Wiley & Sons, New York 1965, Chapter 7.4.

*Primary Examiner*—John S. Chu
*Assistant Examiner*—Barbara Gilmore
*Attorney, Agent, or Firm*—Andrew F. Sayko Jr

[57] ABSTRACT

A process for producing a water insoluble, aqueous alkali soluble, film forming novolak resin having low metal ions, made by the fractionation of a phenol formaldehyde condensation product, a process for producing a resin a photoresist composition of superior quality containing such novolak resin, and a method for producing a semiconductor device using such photoresist composition.

8 Claims, No Drawings

FRACTIONATION OF PHENOL FORMALDEHYDE CONDENSATE AND PHOTORESIST COMPOSITIONS PRODUCED THEREFROM

This application is a division of application Ser. No. 08/530,847 filed Sep. 20, 1995, now U.S. Pat. No. 5,739,265.

BACKGROUND OF THE INVENTION

The present invention relates to a process for producing thermally stable, water insoluble, aqueous alkali soluble, film forming novolak resins and their use in light-sensitive compositions useful as positive-working photoresist compositions. Further, the present invention relates to a process for coating substrates with these light-sensitive compositions, as well as the process of coating, imaging and developing these light-sensitive mixtures on these substrates.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of one micron or less are necessary. In addition, it is almost always desirable that the developed photoresist wall profiles be near vertical relative to the substrate. Such demarcations between developed and undeveloped areas of the resist coating translate into accurate pattern transfer of the mask image onto the substrate.

SUMMARY OF THE INVENTION

The present invention relates to a process for fractionating a phenol formaldehyde condensation product to produce a water insoluble aqueous alkali soluble novolak resin and its use in photoresist compositions. The invention further relates to a process for producing a positive-working photoresist containing such high thermal stability, water insoluble, aqueous alkali soluble, film forming novolak resins and a photosensitizer, and the use of such photoresists in producing semiconductor devices.

The invention provides a process for producing a water insoluble, aqueous alkali soluble, film forming novolak resin by condensing one or more methyl phenols and formaldehyde or trioxane in the presence of an acid catalyst and dissolving the novolak resin in a suitable solvent, such as methanol, and fractioning the resulting novolak resin, the process comprising:

1) providing a solution of from about 10% to 40%, by weight, preferably from about 15% to about 35%, most preferably from about 20% to about 30%, of a water insoluble, alkali soluble, film forming novolak resin in a suitable polar organic solvent, such as methanol, ethanol, acetone or tetrahydrofuran (THF);

2) filtering the novolak resin solution through a filter having a rating of less than 1 $\mu$m (micrometer), preferably from about 0.1 $\mu$m (micrometer) to less than 1 $\mu$m (micrometer), most preferably from about 0.1 $\mu$m (micrometer) to about 0.4 $\mu$m (micrometer);

3) passing the novolak resin solution through an anion exchange resin, such as Amberlyst® 21 resin;

4) passing the novolak resin solution through a cation exchange resin, such as Amberlyst® 15 resin;

5) adding the resulting deionized novolak resin solution to deionized (DI) water, preferably over a period of from about 2 to about 3 hours, at a ratio of water to novolak resin solution of about 65 to about 35, preferably about 55 to about 45;

6) agitating the novolak resin solution/water mixture for at least about 30 minutes, preferably at least about 45 minutes and most preferably at least about 60 minutes (there is no limit to the amount of time the mixture may be agitated, although a practical limit will be about 2 hours);

7) filtering (e.g. through a Buckner funnel) and washing the novolak resin solution/water mixture at least 3 times, with DI water, to provide a filter cake;

8) adding the resulting filter cake to a photoresist solvent to a level of from about 40% to about 65%, by weight, preferably from about 45% to about 60%, most preferably from about 50% to about 55% of solid; a suitable photoresist solvent, such as propylene glycol monomethyl ether acetate (PGMEA), propylene glycol monoethyl ether acetate or 3-methoxy-3-methyl-1-butanol (MMB) is used;

9) distilling off substantially all of the remaining water and polar organic solvent, under vacuum at a temperature of from about 90° C. to about 130° C., preferably from about 100° C. to about 120° C., and a pressure of from about 50 mm to about 120 mm, preferably from about 80 mm to about 110 mm, most preferably from about 90 mm to about 100 mm;

10) cooling the remaining novolak resin solution to a temperature of from about 25° C. to about 45° C., preferably from about 30° C. to about 40° C., most preferably from about 30° C. to about 35° C.;

11) adjusting the solids content of the novolak resin solution to a desired level by adding, if necessary, additional solvent;

12) filtering the novolak resin solution through a filter having a rating of less than 1 μm (micrometer), most preferably from about 0.1 μm (micrometer) to less than 1 μm (micrometer), most preferably from about 0.1 μm (micrometer) to about 0.4 μm (micrometer).

The invention also provides a process for producing a high thermal positive photoresist composition comprising:

1) providing a solution of from about 10% to 40%, by weight, preferably from about 15% to about 35%, most preferably from about 20% to about 30%, of an alkali soluble, water insoluble, film forming novolak resin in a suitable polar organic solvent, such as methanol, ethanol, acetone or tetrahydrofuran (THF);

2) filtering the novolak resin solution through a filter having a rating of less than 1 μm (micrometer), preferably from about 0.1 μm (micrometer) to less than 1 μm (micrometer), most preferably from about 0.1 μm (micrometer) to about 0.4 μm (micrometer);

3) passing the novolak resin solution through an anion exchange resin, such as Amberlyst® 21 catalyst;

4) passing the novolak resin solution through a cation exchange resin, such as Amberlyst® 15 catalyst;

5) adding the resulting deionized novolak resin solution to deionized (DI) water, preferably over a period of from about 2 to about 3 hours, at a ratio of water to novolak resin solution of about 65 to about 35, preferably about 55 to about 45;

6) agitating the novolak resin solution/water mixture for at least about 30 minutes, preferably at least about 45 minutes, and most preferably at least about 60 minutes (There is no limit to the amount of time the mixture may be agitated, although a practical limit will be about 2 hours);

7) filtering and washing, preferably at least 3 times, with DI water to provide a filter cake;

8) adding the resulting filter cake to a photoresist solvent to make from about 40% to about 65% by weight preferably from about 45% to about 60%, most preferably from about 50% to about 55% of solid. The suitable photoresist solvent, such as propylene glycol monomethyl ether acetate (PGMEA), propylene glycol monoethyl ether acetate or 3-methoxy-3-methyl-1-butanol (MMB) can be used.

9) distilling off substantially all of the remaining water and polar organic solvent, under vacuum at a temperature of from about 90° C. to about 130° C., preferably from about 100° C. to about 120° C., and a pressure of from about 50 mm to about 120 mm, preferably from about 80 mm to about 10 mm, most preferably from about 90 mm to about 100 mm;

10) cooling the remaining novolak resin solution to a temperature of from about 25° C. to about 45° C., preferably from about 30° C. to about 40° C., most preferably from about 30° C. to about 35° C.;

11) adjusting the solids content of the novolak resin solution to a desired level by adding, if necessary, additional solvent;

12) filtering the novolak resin solution through a filter having a rating of less than 1 μm (micrometer), most preferably from about 0.1 μm (micrometer) to less than 1 μm (micrometer), most preferably from about 0.1 μm (micrometer) to about 0.4 μm (micrometer);

13) formulating a photoresist composition solution by providing an admixture of: a) a photosensitive component in an amount sufficient to photosensitive the photoresist composition, b) the subject film forming novolak resin, such novolak resin being present in the photoresist composition in an amount sufficient to form a substantially uniform photoresist composition; and c) a suitable photoresist solvent.

The invention further provides a method for producing a semiconductor device by producing a photoresist image on a substrate by coating a suitable substrate with a positive working photoresist composition, the process comprising:

1) providing a solution of from about 10% to 40%, by weight, preferably from about 15% to about 35%, most preferably from about 20% to about 30%, of an alkali soluble, water insoluble, film forming novolak resin in a suitable polar organic solvent, such as methanol, ethanol, acetone or tetrahydrofuran (THF);

2) filtering the novolak resin solution through a filter having a rating of less than 1 μm (micrometer), preferably from about 0.1 μm (micrometer) to less than 1 μm (micrometer), most preferably from about 0.1 μm (micrometer) to about 0.4 μm (micrometer);

3) passing the novolak resin solution through an anion exchange resin, such as Amberlyst® 21 catalyst;

4) passing the novolak resin solution through a cation exchange resin, such as Amberlyst® 15 catalyst;

5) adding the resulting deionized novolak resin solution to deionized (DI) water, preferably over a period of from about 2 to about 3 hours, at a ratio of water to novolak resin solution of about 65 to about 35, preferably about 55 to about 45;

6) agitating the novolak resin solution/water mixture for at least about 30 minutes, preferably at least about 45 minutes and most preferably at least about 60 minutes (there is no limit to the amount of time the mixture may be agitated, although a practical limit will be about 2 hours);

7) filtering and washing the novolak resin solution/water mixture, preferably at least 3 times, with DI water;

8) adding the resulting filter cake to a photoresist solvent to at a level from about 40% to about 65%, by weight, preferably from about 45% to about 60%, most preferably from about 50% to about 55% of solid; a suitable photoresist solvent, such as propylene glycol monomethyl ether acetate (PGMEA), propylene glycol monoethyl ether acetate or 3-methoxy-3-methyl-1-butanol (MMB) is used;

9) distilling off substantially all of the remaining water and polar organic solvent, under vacuum at a temperature of from about 90° C. to about 130° C., preferably from about 100° C. to about 120° C., and a pressure of from about 50 mm to about 120 mm, preferably from about 80 mm to about 110 mm, most preferably from about 90 mm to about 100 mm;

10) cooling the remaining novolak resin solution to a temperature of from about 25° C. to about 45° C., preferably from about 30° C. to about 40° C., most preferably from about 30° C. to about 35° C.;

11) adjusting the solids content of the novolak resin solution to a desired level by adding, if necessary, additional solvent;

12) filtering the novolak resin solution through a filter having a rating of less than 1 μm (micrometer), most preferably from about 0.1 μm (micrometer) to less than 1 μm (micrometer), most preferably from about 0.1 μm (micrometer) to about 0.4 μm (micrometer);

13) formulating a photoresist composition solution by providing an admixture of: a) a photosensitive component in an amount sufficient to photosensitize the photoresist composition, b) the subject film forming novolak resin, such novolak resin being present in the photoresist composition in an amount sufficient to form a substantially uniform photoresist composition; and c) a suitable photoresist solvent;

14) heat treating the coated substrate until substantially all of the solvent is removed; image-wise exposing the photosensitive composition; and removing the image-wise exposed areas of such composition with an aqueous alkaline developer. Optionally one may perform a baking of the substrate either immediately before or after the removing step.

DETAILED DESCRIPTION OF THE PREFERRED EMBODIMENT

Alkali soluble novolak resins have been commonly used in photoresists, as exemplified by "Chemistry and Application of Phenolic Resins", Knop A. And Scheib, W.; Springer Verlag, New York, 1979 in Chapter 4. Similarly, o-quinone diazides are well known to the skilled artisan as demonstrated by "Light Sensitive Systems", Kosar, J.; John Wiley & Sons, New York, 1965 Chapter 7.4. However, according to the process of the instant invention, it has found that the use of resins fractionated according to this process produces a photoresist having high thermal stability.

The particular novolak resins produced by the process of the present invention are water insoluble, aqueous alkali soluble resins. Such novolak resins have a preferred weight average molecular weight (GPC) in the range of from about 20,000 to about 30,000, or more preferably from about 22,000 to about 28,000.

The sensitizer which comprises a component of the photoresist composition of the present invention may be an ester of one or more multihydroxy phenolic or alcoholic compound, preferably a trihydroxyphenylethane or a hydroxybenzophenone and a sulfonic acid or sulfonic acid derivative thereof, such as a sulfonyl chloride, such as described in U.S. Pat. Nos. 3,106,465 and 4,719,167, which are incorporated herein by reference.

The photoresist composition is formed by blending the ingredients in a suitable photoresist solvent. In the preferred embodiment, the amount of novolak resin in the photoresist preferably ranges from 18% to about 40% and more preferably from about 20% to about 30% based on the weight of the solid; i.e., non-solvent photoresist components. In the preferred embodiment, the photosensitizer is present in the photoresist in an amount of from about 3% to about 8% preferably from about 4% to about 6% based on the weight of the solid photoresist components. In producing the photoresist composition, the novolak resin and sensitizer are mixed with such solvents as propylene glycol mono-alkyl ether, propylene glycol alkyl ether acetate, butyl acetate, xylene, ethylene glycol monoethyl ether acetate, propylene glycol mono-methyl ether acetate, 2-heptanone, ethyl lactate, ethyl-3-ethoxypropionate, and mixtures of ethyl lactate and ethyl-3-ethoxypropionate, among others.

Other optional ingredients such as colorants, dyes, anti-striation agents, leveling agents, plasticizers, adhesion promoters, speed enhancers, solvents and such surfactants as non-ionic surfactants may be added to the solution of novolak resin, sensitizer and solvent before the solution is coated onto a substrate. Examples of dye additives that may be used together with the photoresist compositions of the present invention include Methyl Violet 2B (C.I. No. 42535), Crystal Violet (C.I. 42555). Malachite Green (C.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used at up to about a five percent weight level, based on the combined weight of resin and sensitizer. Plasticizers which may be used include, for example, phosphoric acid tri-(beta-chloroethyl)-ester; stearic acid; dicamphor; polypropylene; acetal resins; phenoxy resins; and alkyl resins, at about one to ten percent weight levels, based on the combined weight of novolak and sensitizer. The plasticizer additives improve the coating properties of the material and enable the application of a film that is smooth and of uniform thickness to the substrate.

Adhesion promoters which may be used include, for example, beta-(3,4-epoxycyclohexyl)-ethyltrimethoxy-silane; p-methyl-disilane-methylmethacrylate; vinyltrichlorosilane; and gamma-amino-propyltriethoxysilane up to about a 4 percent weight level, based on the combined weight of resin and sensitizer. Development speed enhancers that may be used include, for example, picric acid, nicotinic acid or nitrocinnamic acid up to about a 20 percent weight level, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The coating solvents may be present in the overall composition in an amount of up to 95% by weight of the solids in the composition. Solvents, of course are substantially removed after coating of the photoresist solution on a substrate and drying. Non-ionic surfactants that may be used include, for example, nonylphenoxy poly(ethyleneoxy) ethanol; octylphenoxy ethanol at up to about 10% weight levels, based on the combined weight of resin and sensitizer.

The prepared photoresist solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing hexa-alkyl disilazane.

The photoresist composition solution is then coated onto the substrate, and the substrate is treated at a temperature from about 70° C. to about 110° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times. The coating substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The photoresist is then optionally subjected to a post exposure second baking or heat treatment either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in an alkaline developing solution or developed by spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

60 grams of wet AMBERLYST® 21 anion exchange resin beads were placed in a one liter conical flask and deionized water was added so that all of the resin beads were under water. The flask was sealed and allowed to stand overnight to swell the resin beads. The next morning the water was decanted, deionized water was added to again cover the resin beads and the flask was shaken slowly. The water was again decanted. The rinsing with deionized water and decanting steps were repeated three more times. The resulting slurry of ion exchange resin was poured into a 200 ml glass column equipped with a porous disk and a stopcock. The resin was allowed to settle to the bottom and the column was back flushed with deionized water for 25 minutes. The resin was again allowed to settle to the bottom.

The bed length was measured and the bed volume was calculated as 120 ml. A 10 percent sulfuric acid solution was passed down through the resin bed at a rate of about 10 ml./min so that the residence time is 12 minutes. 6 bed volumes of the acid solution were passed through the resin bed. 6 bed volumes of deionized water were then passed down through the resin bed at about the same flow rate. 6 bed volumes of electronic grade ammonium hydroxide solution (6%) were passed through the column at the same rate as above, followed by enough DI water to remove ammonium hydroxide. The pH of the effluent water was measured to assure that it matched the pH of 6 for fresh deionized water. Two bed volumes of electronic grade methanol were passed through the column at the same rate as above, to remove water.

60 grams of AMBERLYST® 15 cation exchange resin beads were placed in a one liter conical flask and deionized water was added so that all of the resin beads were under water. The flask was sealed and allowed to stand overnight to swell the resin beads. The next morning the water was decanted, deionized water was added to again cover the resin beads and the flask was shaken slowly. The water was again decanted. The rinsing with deionized water and decanting steps were repeated three more times. The resulting slurry of ion exchange resin was poured into a 200 ml glass column equipped with a porous disk and a stopcock. The resin was allowed to settle to the bottom and the column was back flushed with deionized water for 25 minutes. The resin was again allowed to settle to the bottom.

The bed length was measured and the bed volume was calculated as 120 ml. A 10 percent sulfuric acid solution was passed down through the resin bed at a rate of about 10 ml./min so that the residence time was 12 minutes. 6 bed volumes of the acid solution were passed through the resin bed. 60 bed volumes of deionized water were then passed through the resin bed at about the same flow rate. The pH of the effluent water was measured to assure that it matched the pH of 6 for fresh deionized water. Two bed volumes of electronic grade methanol were passed through the column at the same rate as above to remove water.

1. Novolak resin was produced by reacting 67.5 weight percent meta-cresol and 32.5 wt. % para-cresol with trioxane in butyl acetate, using para-toluene sulfonic acid as the catalyst. After the condensation reaction was complete, the catalyst was neutralized with triethyl amine. The n-butyl acetate and the water were distilled off. Methanol was added to the resin melt to provide a 60 wt. % solids solution, which was then further diluted with methanol to yield a 24 wt. % solids solution. The GPC weight average molecular weight ($M_w$) of this novolak resin was in the range from 23,000 to 28,000. 360 grams of this novolak resin was added to a 500 ml. beaker. The solution was passed through a 0.2 μm (micrometer) filter, followed by passing the solution through a precleaned Amberlyst® 21 resin and a precleaned Amberlyst® 15 ion exchange resin and then to a cleaned beaker. Samples were taken before the filter, after the filter, after Amberlyst 21 and after Amberlyst® 15 resin treatment, for metal ion testing.
2. The novolak resin from step 1 (580 grams, 24% solid) was charged to a 1 liter flask through a dropping funnel. The temperature was adjusted to 22 to 24° C. The novolak resin solution was added to 730 grams of DI water over 2.5 to 3 hours, and the temperature was maintained less than 24° C. and agitated for one hour;
3. Then filtered through a Buckner funnel and washed with DI water 3 times.
4. The filter cake was then added to 460 g of PGMEA, on stirring.
5. The remaining methanol and water were distilled off under vacuum at 80° C. and 40 mm pressure. (Note: Initially started at atmospheric pressure and pulled vacuum slowly at 40° C. and continued to raise temperature up to about 125° C.).
6. The contents of the flask were cooled down to 40° C. and a sample was taken to determine solids content, water content and GPC weight average molecular weight (Mw). The solids content was adjusted, by adding solvent.
7. The contents of the flask were passed through 0.2 mm filter into a metal ion free plastic bottle.

The results were as follows:

| Example | GPC-Mw | % m-cresol | % p-cresol | % MEOH* | % $H_2O$ | % IPA** |
|---|---|---|---|---|---|---|
| 1 | 25,260 | <0.01 | 2.39 | 0.49 | 0.07 | 0.46 |

MEOH* is methanol
IPA** is isopropylacetate

The novolak resin obtained by the above process and the novolak resin before the fractionation process were tested for metals, the results are as follows in parts per billion (ppb):

| Metals | Control Novolak | After fractination |
|---|---|---|
| Na | 346 | 136 |
| K | 36 | |
| Fe | >19000 | 731 |
| Cr | 12 | |
| Cu | 9 | |
| Ca | 34 | |
| Al | 77 | |
| Mn | 27 | |
| Ni | 9 | |

EXAMPLE 2

Example 1 was repeated and the fractionated resin obtained had the following characterics.

| | |
|---|---|
| GPC Weight Average Molecular weight: | 25,260 |
| para cresol: | 2.39% |
| metacresol: | <0.01% |
| Isopropylacetate: | <0.1% |
| water: | 0.05% |
| Methanol: | 0.1% |

EXAMPLE 3

A photoresist formulation was prepared by mixing 30 grams (40% solid in PGMEA) of low molecular weight fraction of m-cresol/p-cresol/trioxane novolak resin from Example 1 and 68.16 grams (40% solid in PGMEA) of 1703H fraction of m-cresol/p-cresol /trioxane novolak resin described in page 13, available from Hoechst Celanese Corporation, in PGMEA solvent. The formulation also included 9.5 grams of a sensitizer (2,1 5-diazonaphthoquinone ester of trihydroxybenzophenone) ,0.96 grams of THB (trihydroxybenzophenone) and 0.048 grams of Modaflow® surfactant (a methyl methacrylate from Rohm and Haas) and 91.515 grams of PGMEA solvent. The formulation was filtered through a 0.2 μm (micrometer) filter and spin coated onto 4", previously HMDS(hexamethylenedisiloxane) primed, silicon wafers at 2120 rpm/30 seconds, which were then soft baked at 90° C./30 minutes to obtain a 1.25 micron (micrometer) film thickness. The wafers were exposed through a mask at 270 mJ/cm2 on a G-Line stepper. Thermal characteristic of the photoresist composition was found to be 130° C. All wafers were puddle developed using 2.4% TMAH developer at 25±0.5° C. for 60 seconds.

Molecular Weight Data (Mw and Mn):

The molecular weight of the polymers, whether weight average molecular weight Mw, or number average molecular weight Mn, were measured by gel permeation chromatography (GPC) performed on dilute solutions of the polymer in tetrahydrofuran (THF). The actual apparatus employed consisted of a Waters® (Millipore Corp.) programmable automatic sampler, vacuum pump, chromatography columns with heater, and a differential refractometer connected to a Shimadzu® CR 30A data reduction system with accompanying software (version 1.1, Shimadzu part No. T/N 22301309-91). The refractometer used was a Waters® model 410 and four chromatography columns, 500 Angstrom, 1000 Angstrom, 10,000 Angstrom and 100,000

Angstrom (available from Millipore Corp.) were connected in series. The system was calibrated using multiple available polystyrene standards ranging in molecular weight as follows:

GPC CALIBRATION

| Calibration standard (Polystyrene) | Mol. Wt. |
|---|---|
| 1 | 470,000 |
| 2 | 170,000 |
| 3 | 68,000 |
| 4 | 34,500 |
| 5 | 9,200 |
| 6 | 3,200 |
| 7 | 1,250 |

The standards are essentially monodisperse, consisting substantially of a single molecular weight. With the system thus calibrated the weight average molecular weight Mw, the number average molecular weight Mn, and polydispersity. Mw/Mn, were obtained.

We claim:

1. A process for producing a positive photoresist composition, said process consisting essentially of an admixture of:
   A) providing a solution of from about 10% to 40%, by weight of an alkali soluble, water insoluble, film forming novolak resin in a polar organic solvent;
   B) filtering the novolak resin solution through a filter having a rating of less than 1 μm (micrometer);
   C) passing the novolak resin solution through an anion exchange resin;
   D) passing the novolak resin solution through a cation exchange resin;
   E) adding the resulting deionized novolak resin solution to deionized water at a ratio of water to resin solution of about 65 to about 35;
   F) agitating the novolak resin solution/water mixture for at least about 30 minutes;
   G) filtering the mixture and then washing the novolak resin solution with deionized water to thereby provide a filter cake;
   H) adding the filter cake to a photoresist solvent to provide from about 40% to about 65% by weight of solids;
   I) distilling off substantially all of the remaining water and polar organic solvent, under vacuum at a temperature of from about 90° C. to about 130° C. and a pressure of from about 50 mm to about 120 mm;
   J) cooling the remaining novolak resin solution to a temperature of from about 25° C. to about 45° C.;
   K) adjusting the solids content of the novolak resin solution;
   L) filtering the novolak resin solution through a filter having a rating of less than 1 μm (micrometer);
   M) providing an admixture of:
      1) a photosensitive component in an amount sufficient to uniformly photosensitive a photoresist composition;
      2) the novolak resin solution from step L); and
      3) a suitable photoresist solvent.

2. The process of claim 1 wherein said photosensitive component is an ester of an alcoholic or phenolic residue and a sulfonic acid or sulfonic acid derivative.

3. The process of claim 1 wherein in C) said photoresist solvent is selected from the group consisting of propylene glycol mono-alkyl ether, propylene glycol alkyl ether acetate, butyl acetate, xylene, ethylene glycol monoethyl ether acetate, ethyl lactate, ethyl-3-ethoxypropionate, and mixtures of ethyl lactate and ethyl-3-ethoxypropionate.

4. The process of claim 1 wherein said photoresist solvent is propylene glycol monomethyl ether acetate.

5. A method for producing a semiconductor device by producing a photoresist image on a substrate by coating a suitable substrate with a positive working photoresist composition produced by the process of claim 1; and
   heat treating the coated substrate until substantially all of the solvent is removed;
   image-wise exposing the photosensitive composition; and removing the image-wise exposed areas of such composition with an aqueous alkaline developer.

6. The method of claim 5 wherein said photosensitive component is an ester of an alcoholic or phenolic residue and a sulfonic acid or sulfonic acid derivative.

7. The method of claim 5 wherein in C) said photoresist solvent is selected from the group consisting of propylene glycol mono-alkyl ether, propylene glycol alkyl ether acetate, butyl acetate, xylene, ethylene glycol monoethyl ether acetate, ethyl lactate, ethyl-3-ethoxypropionate, and mixtures of ethyl lactate and ethyl-3-ethoxypropionate.

8. The method of claim 7 wherein said photoresist solvent is propylene glycol monomethyl ether acetate.

* * * * *